United States Patent
Kamiya et al.

(10) Patent No.: US 10,128,523 B2
(45) Date of Patent: Nov. 13, 2018

(54) FUEL CELL SYSTEM AND CONTROL METHOD FOR THE SAME

(71) Applicant: TOYOTA JIDOSHA KABUSHIKI KAISHA, Toyota-shi, Aichi-ken (JP)

(72) Inventors: Akihiro Kamiya, Toyota (JP); Kenji Umayahara, Miyoshi (JP); Takao Watanabe, Nagakute (JP); Tomoya Ogawa, Okazaki (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 15/584,308

(22) Filed: May 2, 2017

(65) Prior Publication Data

US 2017/0331138 A1 Nov. 16, 2017

(30) Foreign Application Priority Data

May 12, 2016 (JP) .................................. 2016-096346

(51) Int. Cl.
| | |
|---|---|
| H01M 8/18 | (2006.01) |
| G01R 31/36 | (2006.01) |
| H01M 8/04298 | (2016.01) |
| H01M 8/04313 | (2016.01) |
| H01M 8/04537 | (2016.01) |
| H01M 8/04828 | (2016.01) |
| H01M 16/00 | (2006.01) |
| H01M 8/04302 | (2016.01) |
| H01M 8/04858 | (2016.01) |
| G06F 17/18 | (2006.01) |
| H01M 8/1018 | (2016.01) |

(52) U.S. Cl.
CPC .......... *H01M 8/18* (2013.01); *G01R 31/3606* (2013.01); *H01M 8/0494* (2013.01); *H01M 8/04298* (2013.01); *H01M 8/04302* (2016.02); *H01M 8/04313* (2013.01); *H01M 8/04604* (2013.01); *H01M 8/04626* (2013.01); *H01M 8/04953* (2016.02); *H01M 16/006* (2013.01); *G06F 17/18* (2013.01); *H01M 2008/1095* (2013.01); *Y02E 60/50* (2013.01)

(58) Field of Classification Search
CPC ................................ H01M 8/18; H01M 8/04
See application file for complete search history.

(56) References Cited

U.S. PATENT DOCUMENTS

2001/0053950 A1   12/2001   Hasegawa et al.

FOREIGN PATENT DOCUMENTS

| JP | 2001-359204 A | 12/2001 |
| JP | 2004-335343 A | 11/2004 |
| JP | 2012-244714 | 12/2012 |
| JP | 2014-117008 | 6/2014 |

*Primary Examiner* — Olatunji A Godo
(74) *Attorney, Agent, or Firm* — Finnegan, Henderson, Farabow, Garrett & Dunner, LLP

(57) ABSTRACT

A fuel cell system is equipped with a fuel cell and a secondary battery. This fuel cell system is equipped with a recordation unit that records a charge-discharge history of the secondary battery, a prediction unit that predicts restriction on an output of the secondary battery based on the charge-discharge history recorded by the recordation unit, and an output control unit that starts power generation by the fuel cell prior to a timing of restriction on the output of the secondary battery, when the prediction unit predicts restriction on the output of the secondary battery and the fuel cell is in an intermittent operation state.

7 Claims, 5 Drawing Sheets

FUEL CELL SYSTEM AND CONTROL METHOD FOR THE SAME

INCORPORATION BY REFERENCE

The disclosure of Japanese Patent Application No. 2016-096346 filed on May 12, 2016 including the specification, drawings and abstract is incorporated herein by reference in its entirety.

BACKGROUND

1. Technical Field

The disclosure relates to a fuel cell system and a control method for the same.

2. Description of Related Art

A fuel cell system that is equipped with a fuel cell that is supplied with reactive gases (fuel gas and oxidation gas) to generate power has been proposed and put into practical use. The fuel cell is a power generation system that directly converts the energy discharged as a result of an oxidation reaction into electric energy by oxidizing fuel through an electrochemical process.

A fuel cell system of Japanese Patent Application Publication No. 2014-117008 (JP 2014-117008 A) is provided with a secondary battery (a battery) that functions as a storage source of surplus power, an energy buffer at the time of fluctuations in load, or the like. Nowadays, there is provided an art of determining an output from a fuel cell and an output from the secondary battery so as to satisfy an output requirement from a user or auxiliaries.

SUMMARY

By the way, the dischargeable power of the secondary battery is generally determined by a battery temperature and a remaining capacity (a state of charge: SOC). In some cases, however, the dischargeable power is restricted such that a charge-discharge index that is calculated based on a past charge-discharge history does not exceed a predetermined threshold. In the art as described in Japanese Patent Application Publication No. 2014-117008 (JP 2014-117008 A), the restriction on the output due to the past charge-discharge history of the secondary battery is not taken into account. It may therefore be impossible to supply a power satisfying the output requirement.

The disclosure provides a fuel cell system capable of supplying a power satisfying an output requirement even in the case where the restriction on an output due to a past charge-discharge history of a secondary battery is predicted.

A fuel cell system according to one aspect of the disclosure is equipped with a fuel cell and a secondary battery. This fuel cell system is equipped with a recordation unit that records a charge-discharge history of the secondary battery, a prediction unit that predicts restriction on an output of the secondary battery based on the charge-discharge history recorded by the recordation unit, and an output control unit that starts power generation by the fuel cell prior to a timing of restriction on the output of the secondary battery; when the prediction unit predicts restriction on the output of the secondary battery and the fuel cell is in an intermittent operation state.

Besides, a control method according to another aspect of the disclosure is a control method for a fuel cell system that is equipped with a fuel cell and a secondary battery. This control method includes an output control process for starting power generation by the fuel cell prior to a timing of restriction on an output of the secondary battery, when restriction on the output of the secondary battery due to a charge-discharge history of the secondary battery is predicted.

In the case where this configuration and this method are adopted, when the restriction on the output of the secondary battery due to the charge-discharge history of the secondary battery is predicted, power generation by the fuel cell can be started prior to the timing of the restriction on the output of the secondary battery. Accordingly, the supplied output can be prevented from becoming insufficient for the required output.

The control method according to the disclosure may include performing output control for starting power generation by the fuel cell when restriction on the output of the secondary battery is predicted by a prediction unit of an electronic control unit and the fuel cell is in an intermittent operation state.

In the fuel cell system according to the disclosure, the prediction unit can predict restriction on the output of the secondary battery when a sum of an index value that is calculated based on the charge-discharge history of the secondary battery recorded by the recordation unit and a buffer value that is calculated based on a power to be supplied by the secondary battery exceeds a predetermined threshold.

Besides, in the control method according to the disclosure, power generation by the fuel cell can be started when a sum of an index value that is calculated based on the charge-discharge history of the secondary battery and a buffer value that is calculated based on a power to be supplied by the secondary battery exceeds a predetermined threshold.

In the case where this configuration and this method are adopted, when the sum of the index value that is calculated based on the charge-discharge history of the secondary battery and the buffer value that is calculated based on the power to be supplied by the secondary battery exceeds the predetermined threshold, power generation by the fuel cell can be started. Accordingly, power generation by the fuel cell can be started prior to a timing when the index value that is calculated based on the charge-discharge history of the secondary battery exceeds the predetermined threshold (a timing of the restriction on the output). Therefore, the supplied output can be prevented from becoming insufficient for the required output.

In the fuel cell system and the control method according to the disclosure, a time integral value of an output current of the secondary battery can be adopted as the index value, and an integral value of a current that is predicted to be consumed by an auxiliary from issuance of a power generation command to the fuel cell to start of power generation by the fuel cell can be adopted as the buffer value.

The disclosure makes it possible to provide a fuel cell system capable of supplying a power satisfying an output requirement even in the case where the restriction on an output due to a past charge-discharge history of a secondary battery is predicted.

BRIEF DESCRIPTION OF THE DRAWINGS

Features, advantages, and technical and industrial significance of an exemplary embodiment of the disclosure will be described below with reference to the accompanying drawings, in which like numerals denote like elements, and wherein.

DETAILED DESCRIPTION OF EMBODIMENT

Figure 1:
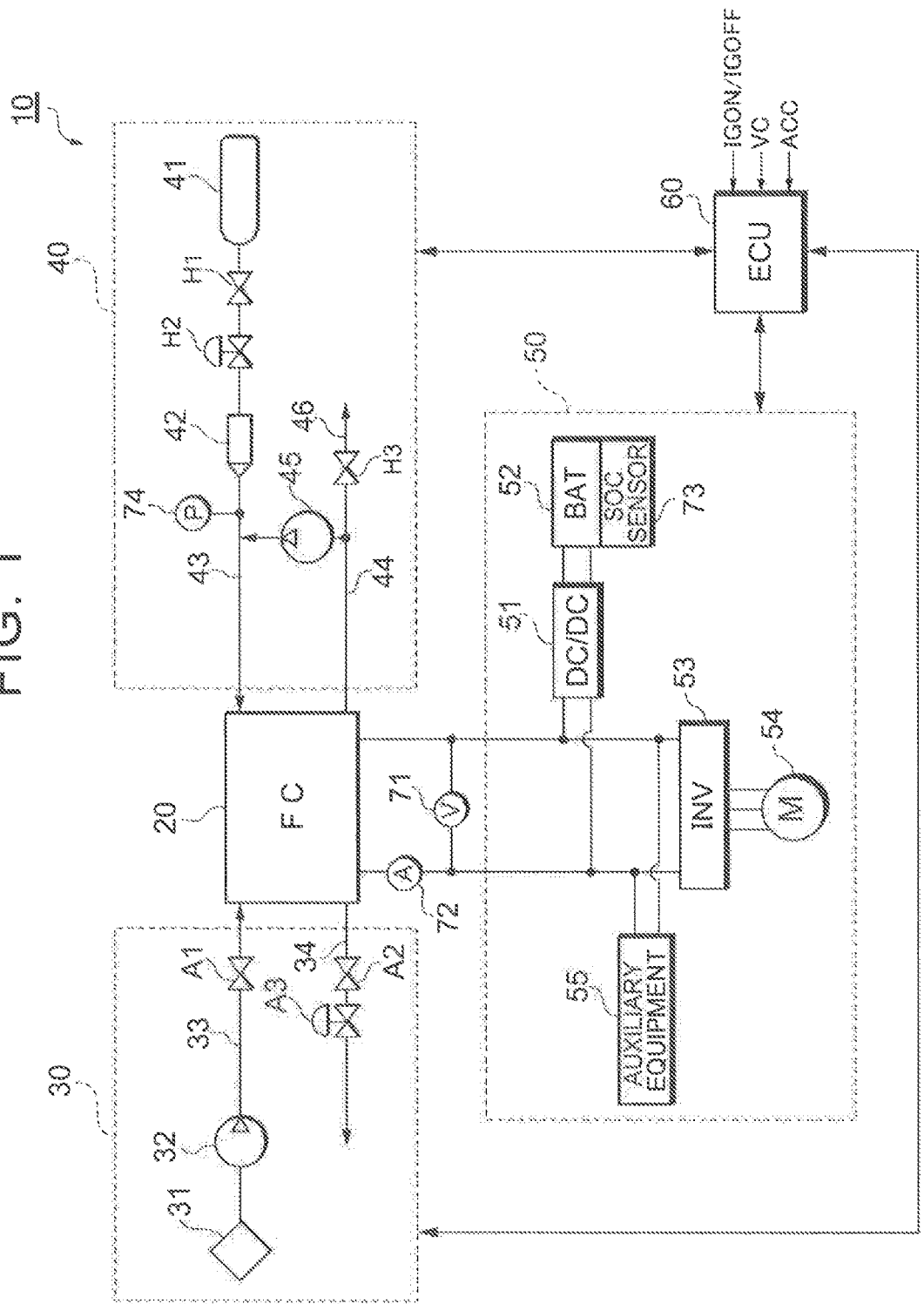
FIG. 1 is an illustrative view showing the outline of the configuration of a fuel cell system according to the embodiment of the disclosure.

The embodiment of the disclosure will be described hereinafter with reference to the respective drawings. Incidentally, the positional relationships such as upper, lower, left and right positions and the like in the drawings are based on those shown in the drawings, unless otherwise specified. Besides, the dimensional ratios in the drawings are not limited to those in the drawings. Furthermore, the following embodiment of the disclosure is an exemplification for illustrating the disclosure. The disclosure is not intended to be limited to this embodiment thereof. Still further, the disclosure can be modified in various manners unless it departs from the gist thereof.

First of all, the configuration of a fuel cell system 10 according to the present embodiment of the disclosure will be described using FIG. 1. The fuel cell system 10 functions as an in-vehicle power supply system that is mounted in, for example, a fuel cell-powered vehicle as a moving body. The fuel cell system 10 is equipped with a fuel cell 20 that is supplied with reactive gases (fuel gas and oxidation gas) to generate power, an oxidation gas supply system 30 for supplying air as oxidation gas to the fuel cell 20, a fuel gas supply system 40 for supplying hydrogen gas as fuel gas to the fuel cell 20, a power system 50 for controlling the charge-discharge of power, and a controller 60 that comprehensively controls the entire system. The controller 60 of the present embodiment of the disclosure is an example of the electronic control unit.

The fuel cell 20 is a solid polyelectrolyte-type cell stack that is configured by stacking a large number of cells in series. An oxidation reaction of a formula (1) occurs at an anode electrode of the fuel cell 20, and a reduction reaction of a formula (2) occurs at a cathode electrode of the fuel cell 20. An electrogenic reaction of a formula (3) occurs in the fuel cell 20 as a whole.

$$H_2 \rightarrow 2H^+ + 2e^- \tag{1}$$

$$(1/2)O_2 + 2H^+ + 2e^- \rightarrow H_2O \tag{2}$$

$$H_2 + (1/2)O_2 \rightarrow H_2O \tag{3}$$

Each of the cells constituting the fuel cell 20 is constituted of a polyelectrolyte membrane, an anode electrode, a cathode electrode and separators. The anode electrode and the cathode electrode sandwich the polyelectrolyte membrane from both sides to form a sandwich structure. The separators are constituted by conductive members impervious to gas, and form a fuel gas flow channel and an oxidation gas flow channel between the anode electrode and the cathode electrode respectively while sandwiching the anode electrode and the cathode electrode from both sides.

Each of the anode electrode and the cathode electrode has a catalytic layer and a gas diffusion layer. The catalytic layer has a piece of catalyst-carrying carbon that carries noble metal particles functioning as a catalyst and made of, for example, platinum-type materials, and a polymer electrolyte. For example, metal catalysts (Pt, Pt—Fe, Pt—Cr, Pt—Ni, Pt—Ru and the like) can be used as the platinum-type materials of the noble metal particles. For example, carbon black can be used as the piece of catalyst-carrying carbon. Proton-conducting ion-exchange resin or the like can be used as the polymer electrolyte. The gas diffusion layer is formed on a surface of the catalytic layer, exhibits air permeability and electron conductivity, and is formed of carbon felt, carbon paper or carbon cloth woven by threads made of carbon fiber.

The polyelectrolyte membrane is a proton-conducting ion-exchange membrane that is formed of a solid polymer material, for example, fluorine resin, and exhibits good electric conductivity in a wet state. The polyelectrolyte membrane, the anode electrode, and the cathode electrode form a membrane-electrode assembly.

As shown in FIG. 1, a voltage sensor 71 for detecting an output voltage (an FC voltage) of the fuel cell 20, and a current sensor 72 for detecting an output current (an FC current) are attached to the fuel cell 20.

The oxidation gas supply system 30 has an oxidation gas passage 33 through which the oxidation gas supplied to the cathode electrode of the fuel cell 20 flows, and an oxidation off gas passage 34 through which the oxidation off gas discharged from the fuel cell 20 flows. The oxidation gas passage 33 is provided with an air compressor 32 that takes in oxidation gas from the atmosphere via a filter 31, and a shutoff valve A1 for shutting off the supply of oxidation gas to the fuel cell 20. The oxidation off gas passage 34 is provided with a shutoff valve A2 for shutting off the discharge of oxidation off gas from the fuel cell 20, and a back pressure adjusting valve A3 for adjusting an oxidation gas supply pressure.

The fuel gas supply system 40 has a fuel gas supply source 41, a fuel gas passage 43 through which the fuel gas supplied to the anode electrode of the fuel cell 20 from the fuel gas supply source 41 flows, a circulation passage 44 for recirculating the fuel off gas discharged from the fuel cell 20 to the fuel gas passage 43, a circulation pump 45 that force-feeds the fuel off gas in the circulation passage 44 to the fuel gas passage 43, and an exhaust drainage passage 46 that is connected to the circulation passage 44 in a branched manner.

The fuel gas supply source 41 is constituted by, for example, a high-pressure hydrogen tank, a hydrogen occlusion alloy or the like, and stores high-pressure (e.g., 35 to 70 MPa) hydrogen gas. When a shutoff valve H1 is opened, fuel gas flows out to the fuel gas passage 43 from the fuel gas supply source 41. Fuel gas is decompressed to, for example, about 200 kPa by a regulator H2 or an injector 42, and is supplied to the fuel cell 20.

The exhaust drainage passage 46, which branches off from the circulation passage 44, is connected to the circulation passage 44. An exhaust drainage valve H3 is disposed in the exhaust drainage passage 46. The exhaust drainage valve H3 operates in accordance with a command from the controller 60, thereby discharging moisture and fuel off gas containing impurities in the circulation passage 44 to the outside.

The fuel off gas discharged via the exhaust drainage valve H3 is mixed with the oxidation off gas flowing through the oxidation off gas passage 34, and is diluted by a diluter (not shown). By being driven by a motor, the circulation pump 45 supplies the fuel off gas in a circulation system to the fuel cell 20 in a circulating manner.

The power system 50 has a DC/DC converter 51, a battery 52, a traction inverter 53, a traction motor 54 and auxiliary equipment 55. The DC/DC converter 51 has a function of boosting a DC voltage supplied from the battery 52 and outputting the boosted DC voltage to the traction inverter 53, and a function of lowering a DC power generated by the fuel cell 20 or a regenerative power recovered by the traction motor 54 through regenerative braking and charging the battery 52 therewith.

The battery 52 is equivalent to the secondary battery in the disclosure, and functions as a storage source of surplus power, a regenerative energy storage source at the time of regenerative braking, an enemy buffer at the time of fluctuations in load resulting from acceleration or deceleration of the fuel cell-powered vehicle, or the like. For example, a nickel-cadmium storage battery, a nickel-hydrogen storage battery, a lithium secondary battery or the like is suitable as the battery 52. An SOC sensor 73 for detecting a state of charge (an SOC) as a remaining capacity of the battery 52 is attached to the battery 52.

The traction inverter 53 is a PWM inverter that is driven according to, for example, a pulse width modulation method. The traction inverter 53 converts a DC voltage output from the fuel cell 20 or the battery 52 into a three-phase AC voltage in accordance with a control command from the controller 60, and controls the rotational torque of the traction motor 54. The traction motor 54 is, for example, a three-phase AC motor, and constitutes a motive power source of the fuel cell-powered vehicle.

The auxiliary equipment 55 is a general term for respective motors that are arranged at respective portions in the fuel cell system 10, inverters for driving these motors, and also various in-vehicle auxiliaries (e.g., the air compressor 32, the injector 42, the circulation pump 45, a radiator, a coolant circulation pump and the like).

The controller 60 is a computer system that is equipped with a CPU, a ROM, a RAM and input/output interfaces, and controls the respective portions of the fuel cell system 10. For example, upon receiving an activation signal 10 output from an ignition switch, the controller 60 starts operating the fuel cell system 10, and obtains a required power of the entire system based on an accelerator depression stroke signal ACC output from an accelerator sensor, a vehicle speed signal VC output from a vehicle speed sensor, and the like. The required power of the entire system is the sum of a vehicle running power and an auxiliary power.

The auxiliary power includes a power consumed by the in-vehicle auxiliaries (the air compressor 32, the circulation pump 45, the coolant circulation pump and the like), a power consumed by devices necessary for the running of the vehicle (a transmission, a wheel control device, a steering device, a suspension and the like), a power consumed by devices disposed in a passenger compartment (an air-conditioner, a lighting apparatus, an audio instrument and the like), and the like.

The controller 60 determines the distribution of the output power of the fuel cell 20 and the battery 52., and controls the oxidation gas supply system 30 and the fuel gas supply system 40 such that the power generation amount of the fuel cell 20 coincides with a target power. Also, the controller 60 controls the DC/DC converter 51, and adjusts the output voltage of the fuel cell 20 to control an operating point (the output voltage and the output current) of the fuel cell 20.

During the operation of the fuel cell system 10, in the fuel cell 20, hydrogen ions produced at the anode electrode penetrate the electrolyte membrane and move to the cathode electrode as indicated by the above-mentioned formula (1), and the hydrogen ions that have moved to the cathode electrode cause an electrochemical reaction with the oxygen in the oxidation gas supplied to the cathode electrode, cause a reduction reaction of oxygen, and produce water as indicated by the above-mentioned formula (2).

Figure 2:
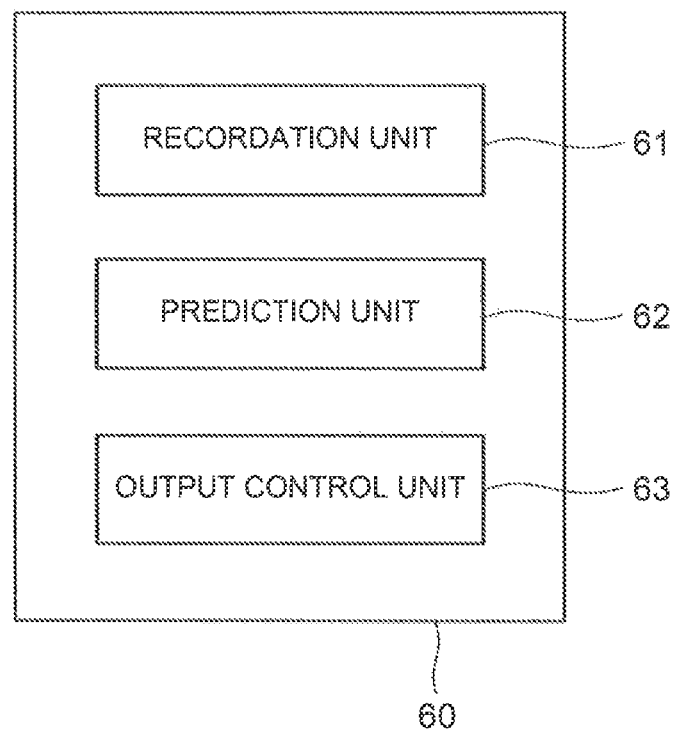
FIG. 2 is a block diagram showing the functional configuration of a controller of the fuel cell system according to the embodiment of the disclosure.

Besides, as shown in FIG. 2, the controller 60 is equipped with a recordation unit 61 that records a charge-discharge history of the battery 52, a prediction unit 62 that predicts the restriction on the output of the battery 52 based on the charge-discharge history recorded by the recordation unit 61, and an output control unit 63 that starts power generation by the fuel cell 20 prior to a timing of the restriction on the output of the battery 52 when the prediction unit 62 predicts the restriction on the output of the battery 52 and the fuel cell 20 is in an intermittent operation state.

The prediction unit 62 in the present embodiment of the disclosure predicts the restriction on the output of the battery 52 when the sum ($\Sigma Q + \varepsilon$) of an index value that is calculated based on the charge-discharge history of the battery 52 recorded by the recordation unit 61 (hereinafter referred to as "a charge-discharge index value) $\Sigma Q$ and a buffer value $\varepsilon$ that is calculated based on a power to be supplied by the battery 52 exceeds a predetermined threshold $\Sigma Q\_limit$. The output control unit 63 starts power generation by the fuel cell 20 when this prediction is made and the fuel cell 20 is in an intermittent operation state. In the present embodiment of the disclosure, a time integral value of an output current of the battery 52 is adopted as the charge-discharge index value $\Sigma Q$, and an integral value of a current that is predicted to be consumed by the auxiliaries such as the air compressor 32 and the like from the issuance of a power generation command to the fuel cell 20 to the start of power generation by the fuel cell 20 is adopted as the buffer value $\varepsilon$.

The operation of output control of the fuel cell system 10 according to the present embodiment of the disclosure will now be described using time charts of FIGS. 3A, 3B and 3C and FIGS. 4A, 4B and 4C.

Figure 3A:
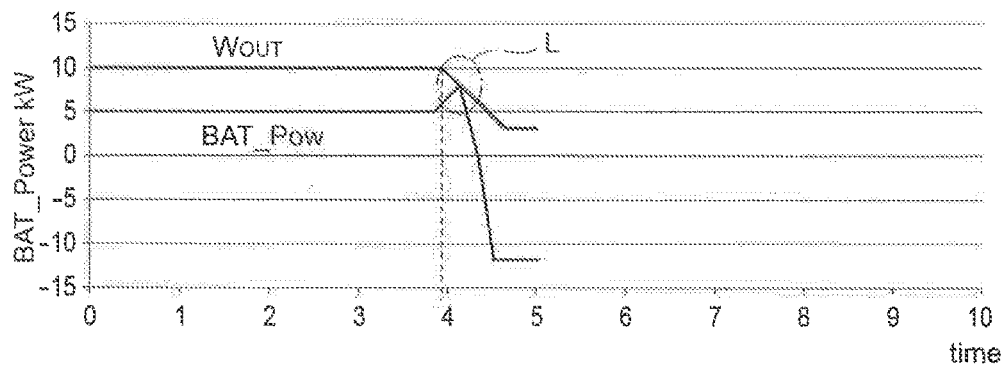
FIG. 3A is a timing chart in the case where a timing when power generation by a fuel cell is started and a timing when restrictions are imposed on an output of a battery due to a charge-discharge history of the battery coincide with each other, and shows a time history of an output power of the battery.
Figure 3B:
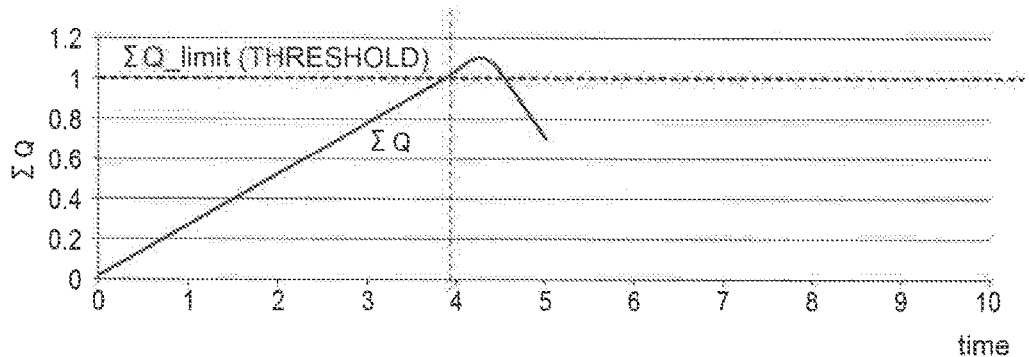
FIG. 3B shows a time history of an index value that is calculated based on the charge-discharge history of the battery.
Figure 3C:
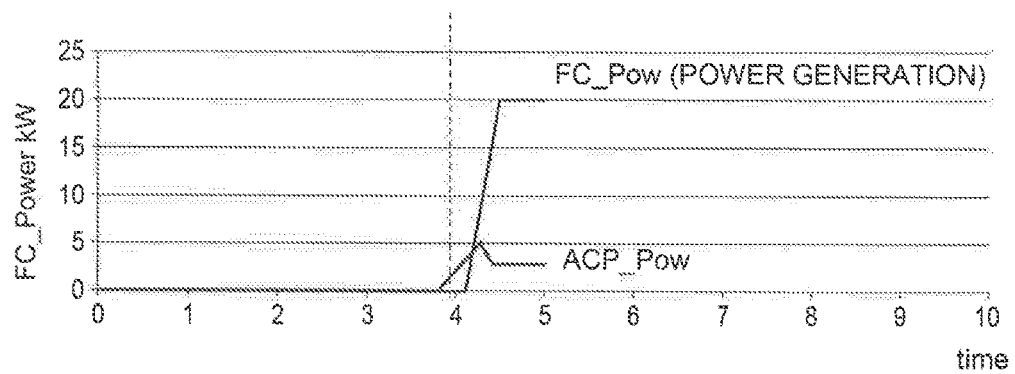
FIG. 3C shows a time history of an output power of the fuel cell.

FIGS. 3A, 3B and 3C are timing charts in the case where a timing when power generation by the fuel cell 20 is started and a timing when restrictions are imposed on the output of the battery 52 due to the charge-discharge history of the battery 52 coincide with each other. In concrete terms, FIG. 3A is a timing chart showing the time history of an output power BAT_Pow of the battery 52. FIG. 3B is a timing chart showing the time history of the charge-discharge index value ΣQ. FIG. 3C is a timing chart showing the time history of an output power FC_Pow of the fuel cell 20.

In starting power generation by the fuel cell 20 when there is an output requirement exceeding the discharge capacity of the battery 52, the air compressor 32 needs to be supplied with power and driven (ACP_Pow) prior to power generation as shown in FIG. 3C. In this case, the power BAT_Pow of the battery 52 is supplied to the air compressor 32 as shown in FIG. 3A. However, if the charge-discharge index value ΣQ exceeds the predetermined threshold ΣQ_limit as shown in FIG. 3B exactly at this moment, a dischargeable power $W_{OUT}$ of the battery 52 decreases and restrictions L are imposed on the output of the battery 52 as shown in FIG. 3A, so the power BAT_Pow supplied to the air compressor 32 from the battery 52 is not sufficient. Then, power generation by the fuel cell 20 may be delayed or become insufficient. As a result, the power satisfying the output requirement cannot be supplied in some cases.

Figure 4A:
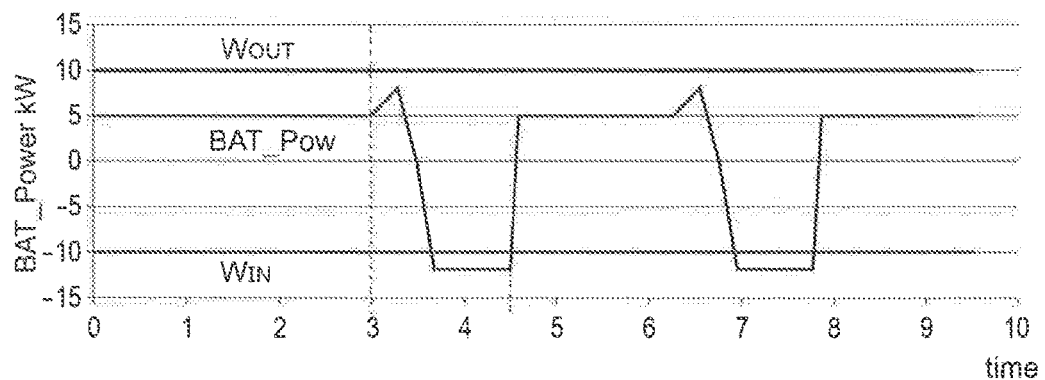
FIG. 4A is a timing chart for illustrating a control method for the fuel cell system according to the embodiment of the disclosure, and shows the time history of the output power of the battery.
Figure 4B:
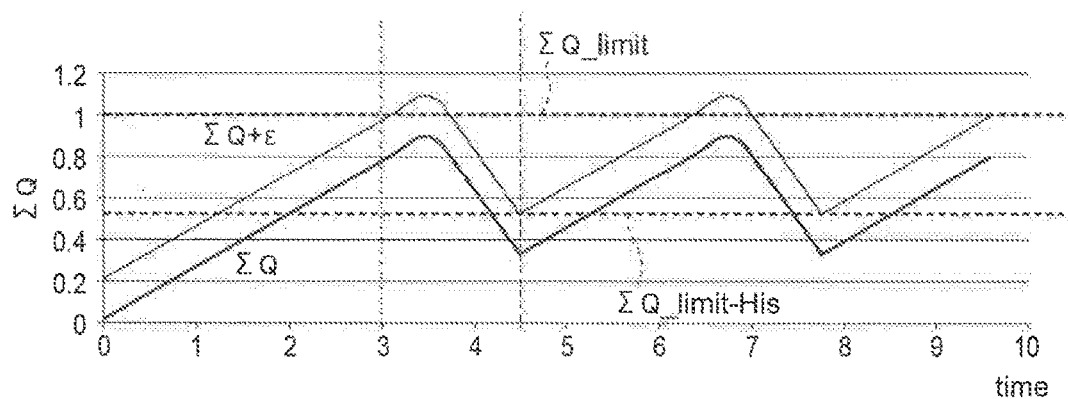
FIG. 4B shows a time history of a value obtained by adding a buffer value to the index value that is calculated based on the charge-discharge history of the battery.
Figure 4C:
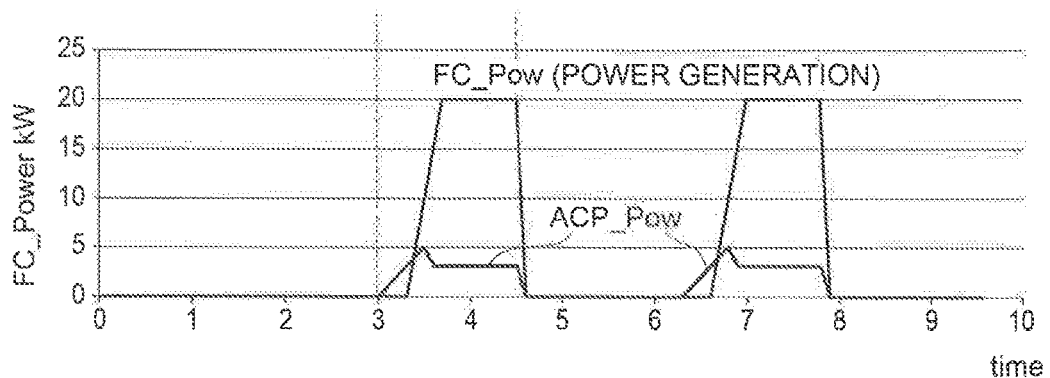
FIG. 4C shows a time history of the output power of the fuel cell.

The disclosure solves this problem. FIGS. 4A, 4B and 4C are timing charts for illustrating a control method for the fuel cell system 10 according to the embodiment of the disclosure. In concrete terms, FIG. 4A is a timing chart showing the time history of the output power BAT_Pow of the battery 52 in the present embodiment of the disclosure. FIG. 4B is a timing chart showing the time history of a value obtained by adding the buffer value ε to the charge-discharge index value ΣQ. FIG. 4C is a timing chart showing the time history of the output power FC_Pow of the fuel cell 20 in the present embodiment of the disclosure.

As shown in FIGS. 4B and 4C, the prediction unit 62 of the controller 60 in the present embodiment of the disclosure predicts the restriction on the output of the battery 52 when the sum of the charge-discharge index value ΣQ and the buffer value ε exceeds the predetermined threshold ΣQ_limit. Then, when the prediction unit 62 makes this prediction and the fuel cell 20 is in an intermittent operation state, the output control unit 63 of the controller 60 supplies the power BAT_Pow from the battery 52 to drive the air compressor 32, and starts power generation by the fuel cell 20. Accordingly, in the present embodiment of the disclosure, power generation by the fuel cell 20 can be started prior to the timing when the charge-discharge index value ΣQ exceeds the predetermined threshold ΣQ_limit (when restrictions are imposed on the output of the battery 52 due to a decrease in the dischargeable power $W_{OUT}$ thereof), so the power satisfying the output requirement can be supplied.

Besides, when the charging of the battery 52 with the output power FC_Pow of the fuel cell 20 progresses beyond a charge capacity $W_{IN}$ of the battery 52 (FIG. 4A), the output control unit 63 of the controller 60 in the present embodiment of the. disclosure stops power generation by the fuel cell 20 (FIG. 4C). In concrete terms, the output control unit 63 stops power generation by the fuel cell 20 when the sum of the charge-discharge index value ΣQ, which has decreased due to the progress of the charging of the battery 52, and the buffer value ε is equal to or smaller than a value obtained by subtracting a constant value His from the predetermined threshold ΣQ_limit (ΣQ_limit-His: FIG. 4B). The constant value His is set to an appropriate value such that the repetition of the start and stop of power generation by the fuel cell 20 does not frequently occur. Incidentally, it is also appropriate to suppress power generation by the fuel cell 20 or consume the surplus power by the auxiliaries, when the charging of the battery 52 progresses beyond the charge capacity $W_{IN}$ thereof.

Figure 5:
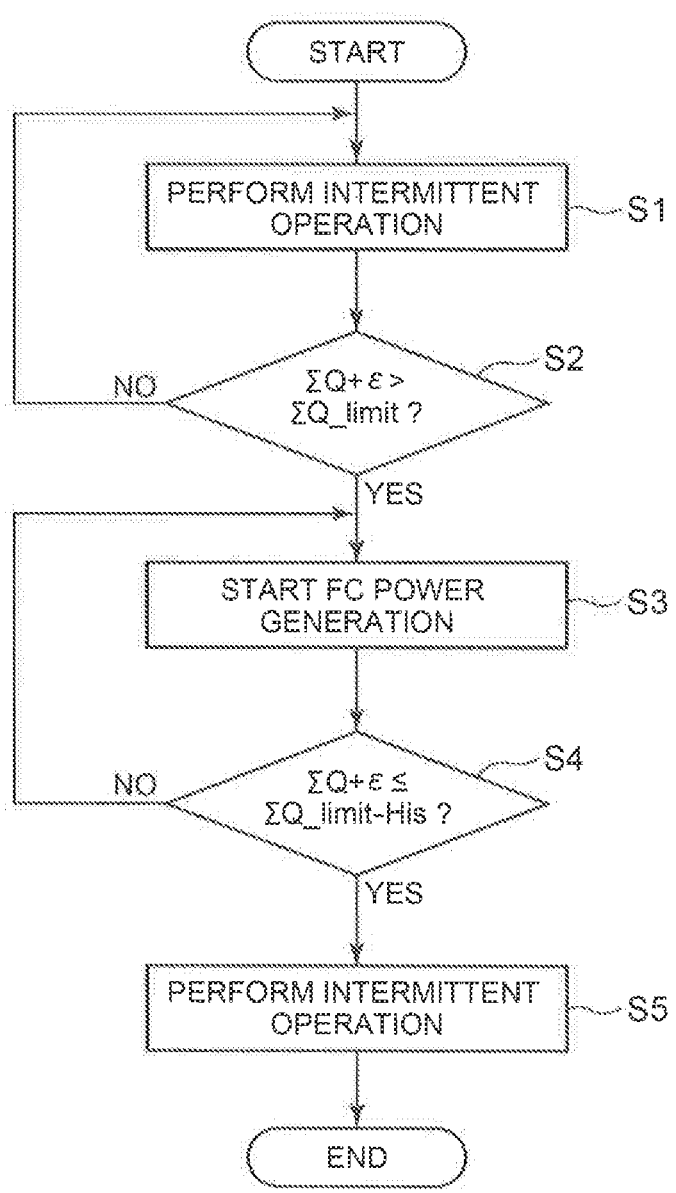
FIG. 5 is a flowchart for illustrating the control method for the fuel cell system according to the embodiment of the disclosure.

Next, the control method for the fuel cell system 10 according to the present embodiment of the disclosure will be described using a flowchart of FIG. 5.

The controller 60 of the fuel cell system 10 performs "intermittent operation" (an intermittent operation performance process: S1). Intermittent operation is defined as an operation of temporarily stopping power generation by the fuel cell 20 when it is determined that the power (the output requirement) to be derived from the fuel cell 20 is small and that the power satisfying the output requirement can be supplied by the power output only from the battery 52.

The controller 60 determines whether or not the sum of the charge-discharge index value ΣQ and the buffer value ε exceeds the predetermined value ΣQ_limit (an FC power generation determination process: S2) while this intermittent operation is performed. If this sum exceeds the threshold ΣQ_limit, the controller 60 supplies the power BAT_Pow from the battery 52 to drive the air compressor 32, and starts power generation by the fuel cell 20 (an FC power generation process: S3). On the other hand, if it is determined in the FC power generation determination process S2 that the sum of the charge-discharge index value ΣQ and the buffer value ε is equal to or smaller than the predetermined threshold ΣQ_limit, the controller maintains intermittent operation.

After having passed through the FC power generation process S3, the controller 60 determines whether or not the sum of the charge-discharge index value ΣQ and the buffer value ε equal to or smaller than the value (ΣQ_limit-His) obtained by subtracting the constant value His from the predetermined threshold ΣQ_limit (an intermittence determination process: S4). If this sum is equal to or smaller than ΣQ_limit-His, the controller 60 temporarily stops power generation by the fuel cell 20 (an intermittent operation performance process: S5). On the other hand, if it is determined in the intermittence determination process S4 that the sum of the charge-discharge index value ΣQ and the buffer value ε is larger than ΣQ_limit-His, the controller 60 maintains power generation by the fuel cell 20.

In the fuel cell system 10 according to the embodiment of the disclosure described above, when the restriction on the output of the battery 52 due to the charge-discharge history of the battery 52 is predicted, power generation by the fuel cell 20 can be started prior to the timing of the restriction on the output of the battery 52. In the present fuel cell system 10 in particular, power generation by the fuel cell 20 can be started when the sum of the index value (the charge-discharge index value) ΣQ that is calculated based on the charge-discharge history of the battery 52 and the buffer value ε that is calculated based on the power to be supplied by the battery 52 exceeds the predetermined threshold ΣQ_limit. Accordingly, power generation by the fuel cell 20 can be started prior to the timing when the charge-discharge index value ΣQ exceeds the predetermined threshold ΣQ_limit (the timing of the restriction on the output). Therefore, the supplied output can be prevented from becoming insufficient for the required output.

Incidentally, in the present embodiment of the disclosure, the time integral value of the output current of the battery 52 is adopted as the charge-discharge index value ΣQ, and the integral value of the current that is predicted to be consumed by the auxiliaries such as the air compressor 32 and the like from the issuance of the power generation command to the fuel cell 20 to the start of power generation by the fuel cell 20 is adopted as the buffer value ε. However, other physical quantities can also be adopted as the charge-discharge index value ΣQ and the buffer value ε. For example, a value that depends on the temperature of the battery 52 (that increases as the temperature of the battery 52 falls) can be adopted as the buffer value $\varepsilon$.

Besides, in the present embodiment of the disclosure, the example in which power generation by the fuel cell 20 is started when the sum of the charge-discharge index value $\Sigma Q$ and the buffer value $\varepsilon$ exceeds the predetermined threshold $\Sigma Q\_limit$ has been described. However, a new threshold $\Sigma Q\_limit'$ obtained by subtracting a constant value (e.g., $\varepsilon$) from the predetermined threshold $\Sigma Q\_limit$ may be set, and power generation by the fuel cell 20 may be started when the charge-discharge index value $\Sigma Q$ exceeds this new threshold $\Sigma Q\_limit'$.

Besides, in the present embodiment of the disclosure, "the fuel cell-powered vehicle" has been exemplified as the moving body. However, various moving bodies other than fuel cell-powered vehicles (robots, ships, airplanes and the like) can also be mounted with the fuel cell system according to the disclosure.

The disclosure is not limited to the foregoing embodiment thereof Even after being appropriately changed in terms of design by those skilled in the art, this embodiment of the disclosure fails within the scope of the disclosure as long as it has the characteristics of the disclosure. That is, the respective elements provided in the embodiment of the disclosure and the arrangement, materials, conditions, shapes, sizes and the like thereof are not limited to those exemplified herein, but can be appropriately changed. Besides, the respective elements provided in the embodiment of the disclosure can be combined with one another within a technically possible range. The combinations of these elements also fall within the scope of the disclosure as long as they include the characteristics of the disclosure.

What is claimed is:

1. A fuel cell system comprising:
a fuel cell;
a secondary battery; and
an electronic control unit including
a recordation unit that is configured to record a charge-discharge history of the secondary battery,
a prediction unit that is configured to predict restriction on an output of the secondary battery based on the charge-discharge history recorded by the recordation unit, and
an output control unit that is configured to start power generation by the fuel cell prior to a timing of restriction on the output of the secondary battery, when the prediction unit predicts restriction on the output of the secondary battery and the fuel cell is in an intermittent operation state.

2. The fuel cell system according to claim 1, wherein the prediction unit predicts restriction on the output of the secondary battery when a sum of an index value that is calculated based on the charge-discharge history of the secondary battery recorded by the recordation unit and a buffer value that is calculated based on a power to be supplied by the secondary battery exceeds a predetermined threshold.

3. The fuel cell system according to claim 2, wherein the index value is a time integral value of an output current of the secondary battery, and
the buffer value is an integral value of a current that is predicted to be consumed by an auxiliary from issuance of a power generation command to the fuel cell to start of power generation by the fuel cell.

4. A control method for a fuel cell system that is equipped with a fuel cell, a secondary battery and an electronic control unit, the control method comprising:
performing, by the electronic control unit, output control for starting power generation by the fuel cell prior to a timing of restriction on an output of the secondary battery, when restriction on the output of the secondary battery due to a charge-discharge history of the secondary battery is predicted.

5. The control method for the fuel cell system according to claim 4, wherein
output control for starting power generation by the fuel cell is performed when restriction on the output of the secondary battery due to the charge-discharge history of the secondary battery is predicted and the fuel cell is in an intermittent operation state.

6. The control method for the fuel cell system according to claim 4, wherein
power generation by the fuel cell is started by the electronic control unit when a sum of an index value that is calculated based on the charge-discharge history of the secondary battery and a buffer value that is calculated based on a power to be supplied by the secondary battery exceeds a predetermined threshold, in the output control.

7. The control method for the fuel cell system according to claim 6, wherein
the index value is a time integral value of an output current of the secondary battery, and
the buffer value is an integral value of a current that is predicted to be consumed by an auxiliary from issuance of a power generation command to the fuel cell to start of power generation by the fuel cell.

* * * * *